United States Patent
Wu et al.

(10) Patent No.: US 10,546,640 B2
(45) Date of Patent: Jan. 28, 2020

(54) DATA PROTECTING METHOD AND MEMORY STORAGE DEVICE

(71) Applicant: PHISON ELECTRONICS CORP., Miaoli (TW)

(72) Inventors: Tsung-Lin Wu, Hsinchu (TW); Te-Chang Tsui, Hsinchu (TW); Chien-Fu Lee, Yunlin County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 105 days.

(21) Appl. No.: 15/591,116

(22) Filed: May 10, 2017

(65) Prior Publication Data

US 2018/0276067 A1    Sep. 27, 2018

(30) Foreign Application Priority Data

Mar. 24, 2017    (TW) .............................. 106109900 A (51) Int. Cl.
| | | |
|---|---|---|
| *G06F 11/10* | (2006.01) | |
| *G11C 16/16* | (2006.01) | |
| *G11C 16/08* | (2006.01) | |
| *G11C 16/26* | (2006.01) | |
| *G11C 16/04* | (2006.01) | |
| *G11C 7/10* | (2006.01) | |
| *G11C 16/22* | (2006.01) | |

(52) U.S. Cl.
CPC .......... *G11C 16/08* (2013.01); *G06F 11/1068* (2013.01); *G11C 7/1006* (2013.01); *G11C 16/22* (2013.01); *G11C 16/0483* (2013.01)

(58) Field of Classification Search
CPC . G06F 11/1044; G11C 16/0483; G11C 16/08; G11C 16/16; G11C 16/26
See application file for complete search history.

(56) References Cited

U.S. PATENT DOCUMENTS

| | | | |
|---|---|---|---|
| 8,484,541 B1 * | 7/2013 | Anholt | H04L 1/004 714/781 |
| 2012/0254680 A1 * | 10/2012 | Oh | G06F 11/1068 714/723 |
| 2013/0166988 A1 * | 6/2013 | Sharon | G06F 11/1012 714/758 |
| 2014/0040534 A1 * | 2/2014 | Low | G06F 12/00 711/103 |
| 2014/0089768 A1 * | 3/2014 | Fujiwara | G06F 11/10 714/785 |
| 2016/0314042 A1 * | 10/2016 | Plants | G06F 11/1068 |
| 2017/0255511 A1 * | 9/2017 | Lin | G06F 3/0619 |

* cited by examiner

*Primary Examiner* — Kyle Vallecillo
(74) *Attorney, Agent, or Firm* — JCIPRNET (57) ABSTRACT

A data protecting method and a memory storage device are provided. The data protecting method includes reading a first string from the rewritable non-volatile memory module to obtain a data string; performing a decoding operation based on the data string to obtain block information corresponding to a plurality of physical erasing units; inputting the block information to an error checking and correcting (ECC) circuit of the memory storage device to generate a second string; and storing the second string into the rewritable non-volatile memory module.

20 Claims, 7 Drawing Sheets

DATA PROTECTING METHOD AND MEMORY STORAGE DEVICE

CROSS-REFERENCE TO RELATED APPLICATION

This application claims the priority benefit of Taiwan application serial no. 106109900, filed on Mar. 24, 2017. The entirety of the above-mentioned patent application is hereby incorporated by reference herein and made a part of this specification.

BACKGROUND

1. Technology Field

The present invention relates to a data protecting method, and more particularly, to a data protecting method for block information of a rewritable non-volatile memory module, and a memory storage device using the same.

2. Description of Related Art

Along with the widespread of digital cameras, cell phones, and MP3 players in recently years, the consumers' demand to storage media has increased drastically. Because a rewritable non-volatile memory is capable of providing features such as data non-volatility, low power consumption, small volume, and non-mechanical structure, high reading and writing speed, the rewritable non-volatile memory has become the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

Generally, the rewritable non-volatile memory module is coupled to a memory storage device for performing an initialization operation. During the initialization operation, a controller of the memory storage device scans the rewritable non-volatile memory module to obtain block information of physical erasing units. Thereafter, the controller of the memory storage device controls an error checking and correcting (ECC) circuit to encode the block information and stores the encoded block information in the rewritable non-volatile memory module.

However, ECC circuits of different memory storage devices may be implemented by using different encoding/decoding algorithms. Thus, the block information encoded by a controller of a memory storage device may be incapable of being decoded and used by a controller of another memory storage device. When the rewritable non-volatile memory module performs a rework operation by various memory storage devices, the controller of each of the memory storage devices has to re-scan the rewritable non-volatile memory module so as to obtain the block information of the physical erasing units, and as a result, the process of the rework operation is time-consuming.

Nothing herein should be construed as an admission of knowledge in the prior art of any portion of the invention. Furthermore, citation or identification of any document in this application is not an admission that such document is available as prior art to the present invention, or that any reference forms a part of the common general knowledge in the art.

SUMMARY

The present invention provides a data protecting method and a memory storage device capable of saving the time for the rework operation.

An exemplary embodiment of the present invention provides a data protecting method for a rewritable non-volatile memory module. The rewritable non-volatile memory module includes a plurality of physical erasing units. The method includes reading a first string from the rewritable non-volatile memory module to obtain a data string, wherein the first string includes first block information corresponding to the physical erasing units. In addition, the method also includes performing a decoding operation according to the data string to obtain second block information corresponding to the physical erasing units. Furthermore, the method includes inputting the second block information into an ECC circuit of a memory storage device equipped with the rewritable non-volatile memory module to perform an encoding operation on the second block information to generate a second string and storing the second string in the rewritable non-volatile memory module, wherein the first string is generated by an external device different from the memory storage device.

An exemplary embodiment of the present invention provides a memory storage device including a connection interface unit, a rewritable non-volatile memory module and a memory control circuit unit. The connection interface unit is configured to couple to a host system. The rewritable non-volatile memory module includes a plurality of physical erasing units. The memory control circuit unit is configured to couple to the connection interface unit and the rewritable non-volatile memory module and has an ECC circuit. A first string and a second string are stored in the rewritable non-volatile memory module. The first string includes first block information and a first ECC code, and the second string includes second block information and a second ECC code. The first error checking and correcting code is generated according to the first block information by an external device executing an encoding unit, and the second error checking and correcting code is generated according to the second block information by the ECC circuit. The second block information is generated by performing a decoding operation according to the first string.

An exemplary embodiment of the present invention provides a memory storage device including a connection interface unit, a rewritable non-volatile memory module and a memory control circuit unit. The connection interface unit is configured to couple to a host system. The rewritable non-volatile memory module includes a plurality of physical erasing units. The memory control circuit unit is configured to couple to the connection interface unit and the rewritable non-volatile memory module and has an ECC circuit. A first string and a second string are stored in the rewritable non-volatile memory module. The first string includes first block information and a first ECC code, and the second string includes second block information and a second ECC code. The first error checking and correcting code is generated according to the first block information by an external device executing an encoding unit, and the second error checking and correcting code is generated according to the second block information by the ECC circuit. The first ECC code is different from the second ECC code.

Based on the above, in the present invention, not only an ECC code corresponding to the block information which is generated by the ECC circuit, but also another ECC code corresponding to the block information which is generated by the encoding unit can be stored in the rewritable non-volatile memory module. In this way, the issue of time-consumption of the process of the rework operation due to the block information encoded by one memory storage device being incapable of being decoded and used by another memory storage device can be resolved.

It should be understood, however, that this Summary may not contain all of the aspects and embodiments of the invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the present invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (which is also referred to as a memory storage system) includes a rewritable non-volatile memory module and a controller (which is also referred to as a control circuit unit). The memory storage device is usually used together with a host system, such that the host system can write data into the memory storage device or read data from the memory storage device.

Figure 1:
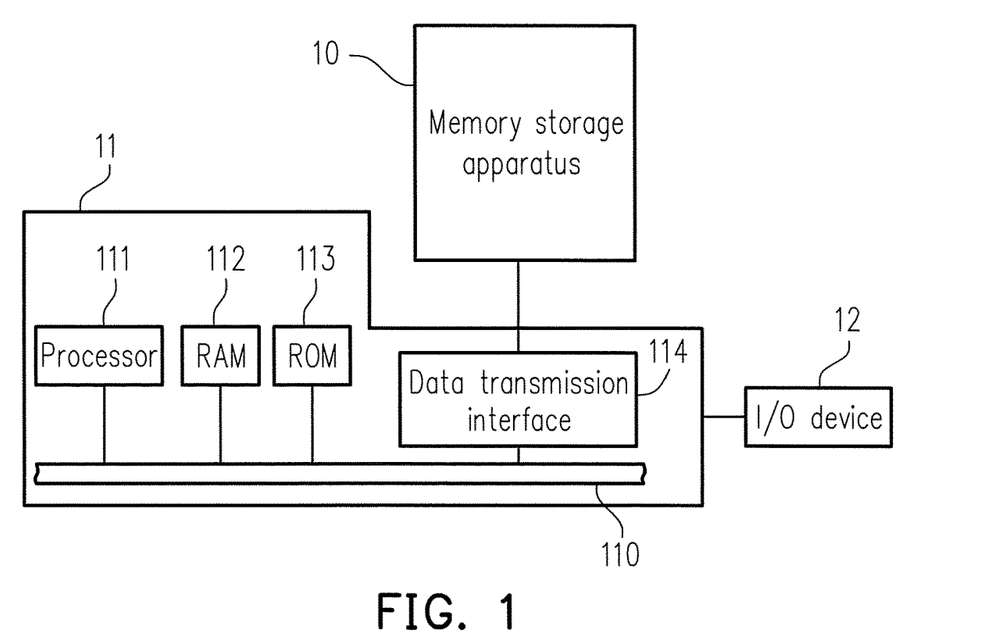
FIG. 1 is a schematic block diagram illustrating a host system, a memory storage device and an input/output (I/O) device according to an exemplary embodiment.
Figure 2:
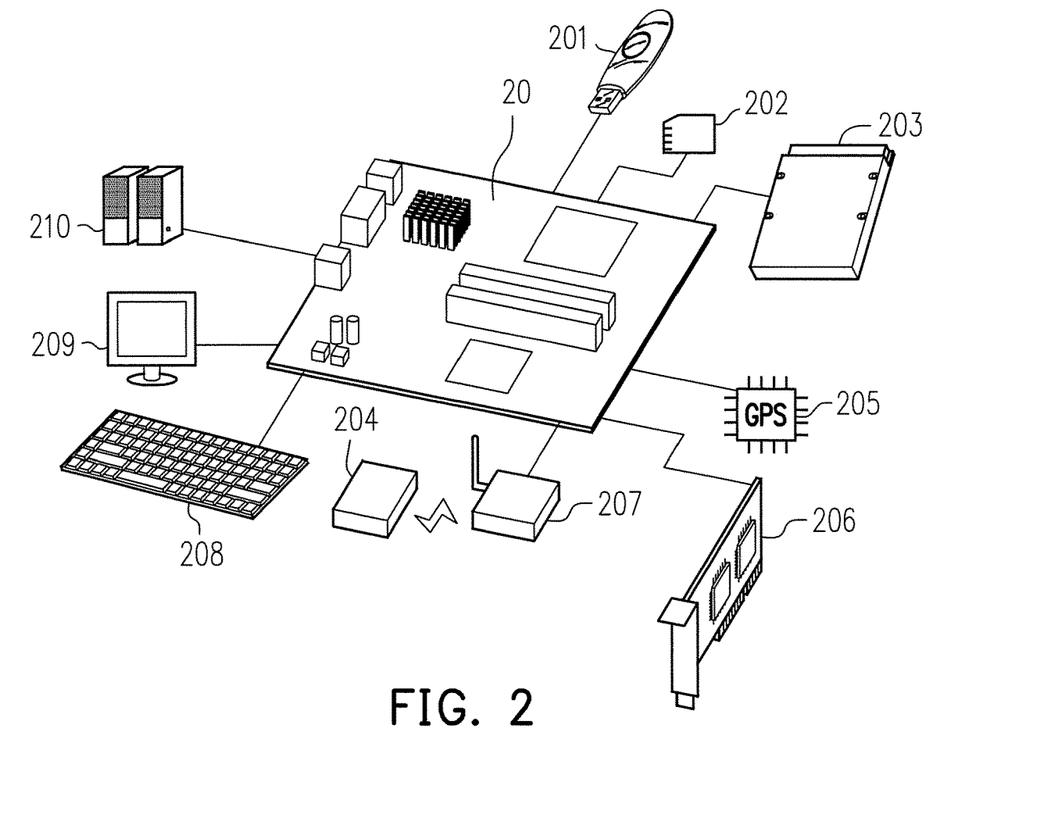
FIG. 2 is a schematic block diagram illustrating a host system, a memory storage device and an I/O device according to another exemplary embodiment.

FIG. 1 is a schematic block diagram illustrating a host system, a memory storage device and an input/output (I/O) device according to an exemplary embodiment, and FIG. 2 is a schematic block diagram illustrating a host system, a memory storage device and an I/O device according to another exemplary embodiment.

Referring to FIG. 1 and FIG. 2, a host system 11 generally includes a processor 111, a random access memory (RAM) 112, a read only memory (ROM) 113 and a data transmission interface 114. The processor 111, the RAM 112, the ROM 113 and the data transmission interface 114 are all coupled to a system bus 110.

In the present exemplary embodiment, the host system 11 is coupled to the memory storage device 10 through the data transmission interface 114. For example, the host system 11 may write data into the memory storage device 10 or read data from the memory storage device 10 through the data transmission interface 114. In addition, the host system 11 is coupled to the I/O device 12 through the system bus 110. For example, the host system 11 may transmit output signals to the I/O device 12 or receive input signals from the I/O device 12 through the system bus 110.

In the present exemplary embodiment, the processor 111, the RAM 112, the ROM 113 and the data transmission interface 114 may be disposed on a mainboard 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a solid state drive (SSD) 203 or a wireless memory storage device 204. The wireless memory storage device 204 may be, for example, a memory storage device based on various wireless communication technologies, such as a near field communication storage (NFC) memory storage device, a WiFi memory storage device, a Bluetooth memory storage device, a low energy (LE) Bluetooth memory storage device (e.g., iBeacon). Additionally, the main board 20 may also be coupled to various 110 devices, such as a global positioning system (GPS) module 205, a network interface card 206, a wireless transmission device 207, a keyboard 208, a monitor 209 and a speaker 210 through the system bus 110. For example, in an exemplary embodiment, the main board 20 can access the wireless memory storage device 204 through the wireless transmission device 207.

In an exemplary embodiment, the aforementioned host system may be any system capable of substantially cooperating with the memory storage device for storing data. Although the host system is illustrated as a computer system in the foregoing exemplary embodiment; however, FIG. 3 is a schematic diagram illustrating a host system and a memory storage device according to another exemplary embodiment.

Figure 3:
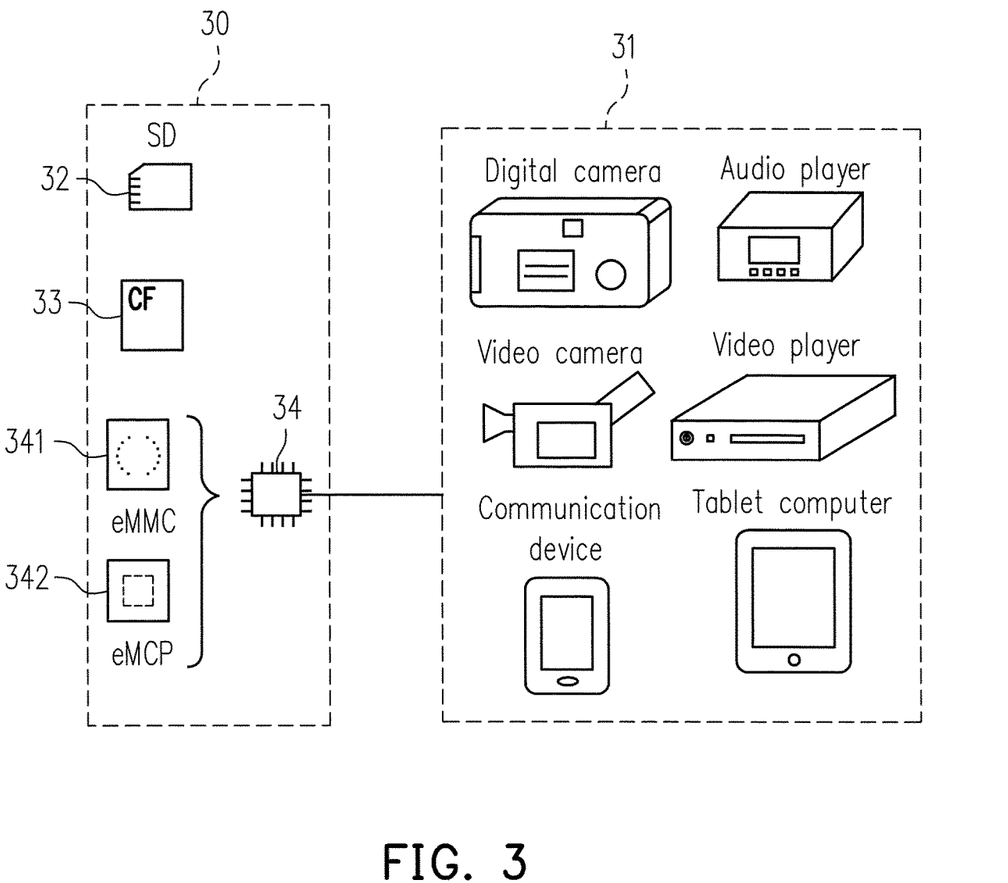
FIG. 3 is a schematic diagram illustrating a host system and a memory storage device according to another exemplary embodiment.

Referring to FIG. 3, in another exemplary embodiment, a host system 31 may also be a system including a digital camera, a video camera, a communication device, an audio player, a video player or a tablet computer, while a memory storage device 30 may be various non-volatile memory storage devices used by the host system 31, such as a SD card 32, a CF card 33 or an embedded storage device 34. The embedded storage device 34 may include an embedded MMC (eMMC) 341 and/or an embedded multi chip package (eMCP) 342, in which a memory module is directly coupled to a substrate of the host system.

Figure 4:
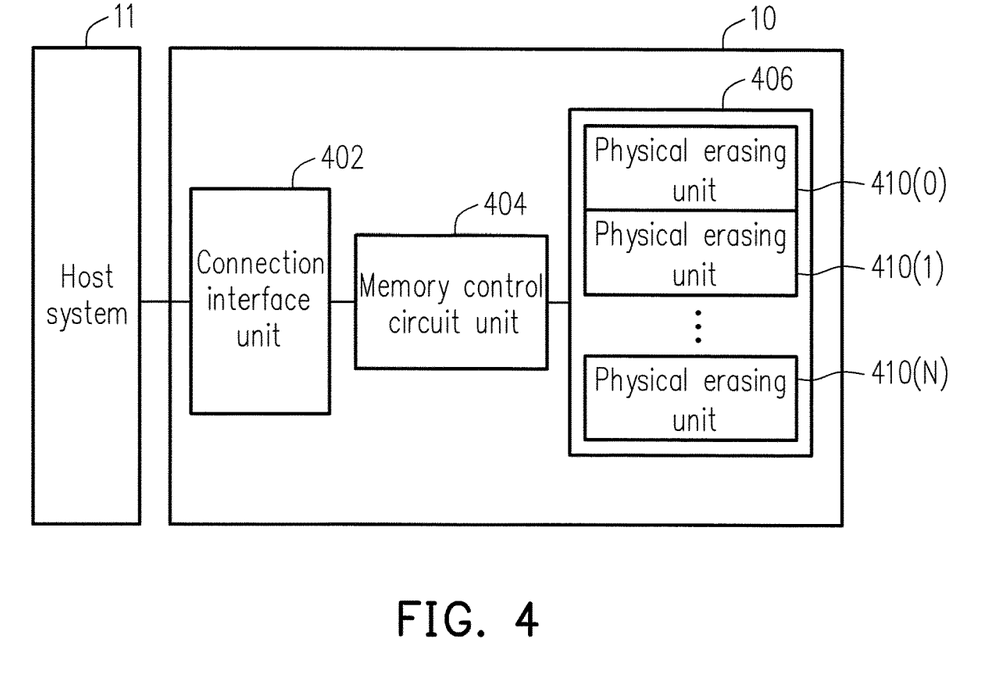
FIG. 4 is a schematic block diagram illustrating the host system and the memory storage device according to an exemplary embodiment.

FIG. 4 is a schematic block diagram illustrating the host system and the memory storage device according to an exemplary embodiment.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a secure digital (SD) interface standard. However, it should be understood that the invention is not limited thereto, and the connection interface unit 402 may also be compatible with a serial advanced technology attachment (SATA) standard, a parallel advanced technology attachment (PATA) standard, an institute of electrical and electronic engineers (IEEE) 1394 standard, a peripheral component interconnect express (PCI Express) standard, a universal serial bus (USB) standard, an ultra high speed-I (UHS-I) interface standard, an ultra high speed-II (UHS-II) interface standard, a memory stick (MS) interface standard, a multi-chip package interface standard, a multi media card (MMC) interface standard, an embedded multimedia card (eMMC) interface standard, a universal flash storage (UFS) interface standard, an embedded multi chip package (eMCP) interface standard, a compact flash (CF) interface standard, an integrated device electronics (IDE) standard or other suitable standards. In the present exemplary embodiment, the connection interface unit 402 may be packaged with the memory control circuit unit 404 in one chip or laid outside a chip including the memory control circuit unit.

The memory control circuit unit 404 is configured to execute a plurality of logic gates or control commands which are implemented in a form of hardware or firmware and perform operations such as data writing, data reading and data erasing in the rewritable non-volatile memory module 406 according to commands issued by the host system 11.

The rewritable non-volatile memory module 406 is coupled to the memory control circuit unit 404 and configured to store data written from the host system 11. The rewritable non-volatile memory storage module 406 includes physical erasing units 410(0) to 410(N). For example, the physical erasing units 410(0) to 410(N) may belong to the same memory die or different memory dies. Each of the physical erasing units includes multiple physical programming units, and the physical programming units belonging to the same physical erasing unit may be written separately but erased altogether at the same time. However, it should be understood that the invention is not limited thereto, and each of the physical erasing units may be composed of 64 physical programming units, 256 physical programming units or any other number of physical programming units.

To be more detailed, a physical erasing unit is the minimum unit for erasing. Namely, each of the physical erasing units has the least number of memory cells to be erased altogether. A physical programming unit is the minimum unit for programming. Namely, the physical programming unit is the minimum unit for writing data. Each of the physical programming units generally includes a data bit area and a redundant bit area. The data bit area including a plurality of physical access addresses is used to store user data, and the redundant bit area is used to store system data (e.g., control information and ECC codes). In the present exemplary embodiment, the data bit area of each physical programming unit contains 8 physical access addresses, and the size of each physical access address is 512 bytes. However, in other exemplary embodiments, the data bit area may contain more or less number of physical access addresses, and the number and the size of the physical access addresses are not limited by the invention. For example, in an exemplary embodiment, the physical erasing units are physical blocks, and the physical programming units are physical pages or physical sectors, but the invention is not limited thereto.

In the present exemplary embodiment, the rewritable non-volatile memory module 406 is a single level cell (SLC) NAND flash memory module (i.e., a flash memory module capable of storing 1 data bit in one memory cell). However, the invention is not limited thereto, and the rewritable non-volatile memory module 406 may also be a multi level cell (MLC) NAND flash memory module (i.e., a flash memory module capable of storing 2 data bits in one memory cell), a trinary level cell (TLC) NAND flash memory module (i.e., a flash memory module capable of storing 3 data bits in one memory cell), any other flash memory module, or any other memory module with the same characteristics.

Figure 5:
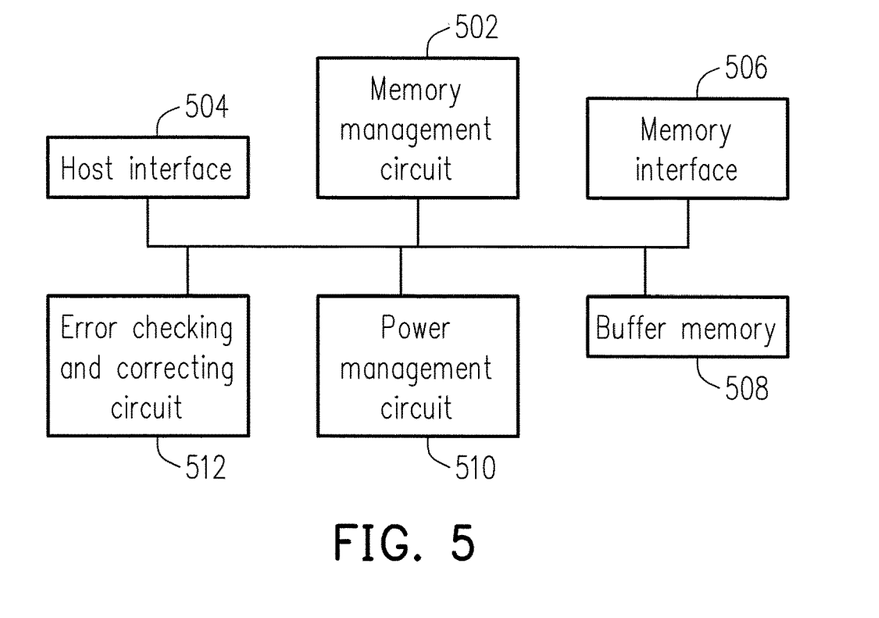
FIG. 5 is a schematic block diagram illustrating the memory control circuit unit according to an exemplary embodiment.

FIG. 5 is a schematic block diagram illustrating the memory control circuit unit according to an exemplary embodiment.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands. When the memory storage device 10 is operated, the control commands are executed to perform operations such as writing, reading and erasing data.

In the present exemplary embodiment, the control commands of the memory management circuit 502 are implemented in a form of firmware. For example, the memory management circuit 502 has a microprocessor unit (not shown) and a read-only memory (ROM, not shown), and the control commands are burnt into the ROM. When the memory storage device 10 is operated, the control commands are executed by the microprocessor unit to perform the operations of writing, reading or erasing data.

In another exemplary embodiment, the control commands of the memory management circuit 502 may also be stored, in form of program codes, in a specific area (for example, a system area in a memory module exclusively used for storing system data) of the rewritable non-volatile memory module 406. In addition, the memory management circuit 502 has a microprocessor unit (not shown), an ROM (not shown) and an RAM (not shown). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit for the operations of writing, reading or erasing data.

Additionally, in another exemplary embodiment, the control commands of the memory management circuit 502 may also be implemented in a form of hardware. For example, the memory management circuit 502 includes a micro-controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro-controller. The memory cell management circuit is configured to manage the physical erasing units of the rewritable non-volatile memory module 406, the memory writing circuit is configured to issue a write command to the rewritable non-volatile memory module 406 to write data into the rewritable non-volatile memory module 406, the memory reading circuit is configured to issue a read command to the rewritable non-volatile memory module 406 to read data from the rewritable non-volatile memory module 406, the memory erasing circuit is configured to issue an erase command to the rewritable non-volatile memory module 406 to erase data from the rewritable non-volatile memory module 406, and the data processing circuit is configured to process data to be written into the rewritable non-volatile memory module 406 or data read from the rewritable non-volatile memory module 406.

The host interface 504 is coupled to the memory management circuit 502 and configured to couple to the connection interface unit 402 to receive and identify commands and data transmitted by the host system 11. That is, the commands and the data transmitted by the host system 11 are transmitted to the memory management circuit 502 through the host interface 504. In the present exemplary embodiment, the host interface 504 is compliable with the SATA standard. However, it should be understood that the present invention is not limited thereto, and the host interface 504 may also be compliable with the PATA standard, the IEEE 1394 standard, the PCI Express standard, the USB standard, the UHS-I interface standard, the UHS-II interface standard, the SD standard, the MS standard, the MMC standard, the CF standard, the IDE standard or other suitable data transmission standards.

The memory interface 506 is coupled to the memory management circuit 502 and configured to access the rewritable non-volatile memory module 406. That is, data to be written into the rewritable non-volatile memory module 406 is converted into a format acceptable by the rewritable non-volatile memory module 406 through the memory interface 506.

In an exemplary embodiment, the memory control circuit unit 404 further includes a buffer memory 508, a power management circuit 510 and an error checking and correcting (ECC) circuit 512.

The buffer memory 508 is coupled to the memory management circuit 502 and configured to temporarily store data and commands from the host system 11 or data from the rewritable non-volatile memory module 406.

The power management circuit 510 is coupled to the memory management circuit 502 and configured to control the power of the memory storage device 10.

The ECC circuit 512 is coupled to the memory management circuit 502 and configured to execute an error checking and correcting (ECC) procedure to ensure data accuracy. To be specific, when the memory management circuit 502 receives a write command from the host system 11, the ECC circuit 512 generates a corresponding error checking and correcting (ECC) code for data corresponding to the write command, and the memory management circuit 502 writes the data corresponding to the write command and the corresponding ECC code into the rewritable non-volatile memory module 406. Thereafter, when reading the data from the rewritable non-volatile memory module 406, the memory management circuit 502 reads the ECC code corresponding to the data, and the ECC circuit 512 performs the ECC procedure on the read data according to the ECC code.

In the present exemplary embodiment, the ECC circuit 512 is implemented by using a low density parity code (LDPC). However, in another exemplary embodiment, the ECC circuit 512 may also be implemented by using other encoding/decoding algorithms, such as a BCH code, a convolutional code, a turbo code, bit flipping.

To be specific, the memory management circuit 502 generates an error checking and correcting frame (which is also referred to as an ECC frame) according to received data and a corresponding ECC code and writes the ECC frame into the rewritable non-volatile memory module 406. Then, when the memory management circuit 502 reads the data from the rewritable non-volatile memory module 406, the ECC circuit 512 verifies accuracy of the data according to ECC code in the ECC frame.

It should be noted that the number of error bits that can be corrected by the ECC circuit 512 is proportional to a size of the ECC code generated thereby. In other words, as the number of the error bits that can be corrected by the ECC circuit 512 is designed to be more, more of the storage spaces are required for storing the ECC codes being generated. Thus, the size of the ECC frame varies with the capability of the ECC circuit 512 for correcting the error bits. For example, in an exemplary embodiment, the maximum number of the error bits that can be corrected by the ECC circuit 512 is up to 40 error bits. Namely, the ECC circuit 512 can successfully correct the error bits as long as the number of the error bits occurred in the read data is not greater than 40.

Additionally, in exemplary embodiment, the memory control circuit unit 404 may further include a data randomizer circuit (not shown). The data randomizer circuit may be coupled to the memory management circuit 502 and configured to convert (disarrange) the data to be written into the rewritable non-volatile memory module 406 and restore (rearrange) the data read from rewritable non-volatile memory module 406. Specifically, for making the data programmed into the rewritable non-volatile memory module 106 to present an irregular random state, the data first goes through a randomization process (e.g., editing, calculating or rearranging) by the data randomizer circuit and then is written, such that the data actually programmed into the physical programming units is properly disarranged to prevent the data from being mistakenly identified due to factors, such as uneven arrangement, shifts in reading voltage or uneven resistance on bit lines. Therein, new data obtained after the randomization process is different from the original data, but a ratio of bits 0 to 1 in the new data may be the same as or different from that in the original data. Likewise, as the data actually programmed into the physical programming units is already converted, the data read from the rewritable non-volatile memory module 406 is restored to the original data by a restoring process of the data randomizer circuit.

In an exemplary embodiment, the data to be stored may be encoded by the ECC circuit 512 to generate encoded data, and then the encoded data is converted by the data randomizer circuit. However, in another exemplary embodiment, the data to be stored may also be first converted by the data randomizer circuit to generate converted data, and then, the converted data may be encoded by the ECC circuit 512. In addition, the data randomizer circuit may be implemented separately from the ECC circuit 512 or implemented in the ECC circuit 512.

Figure 6:
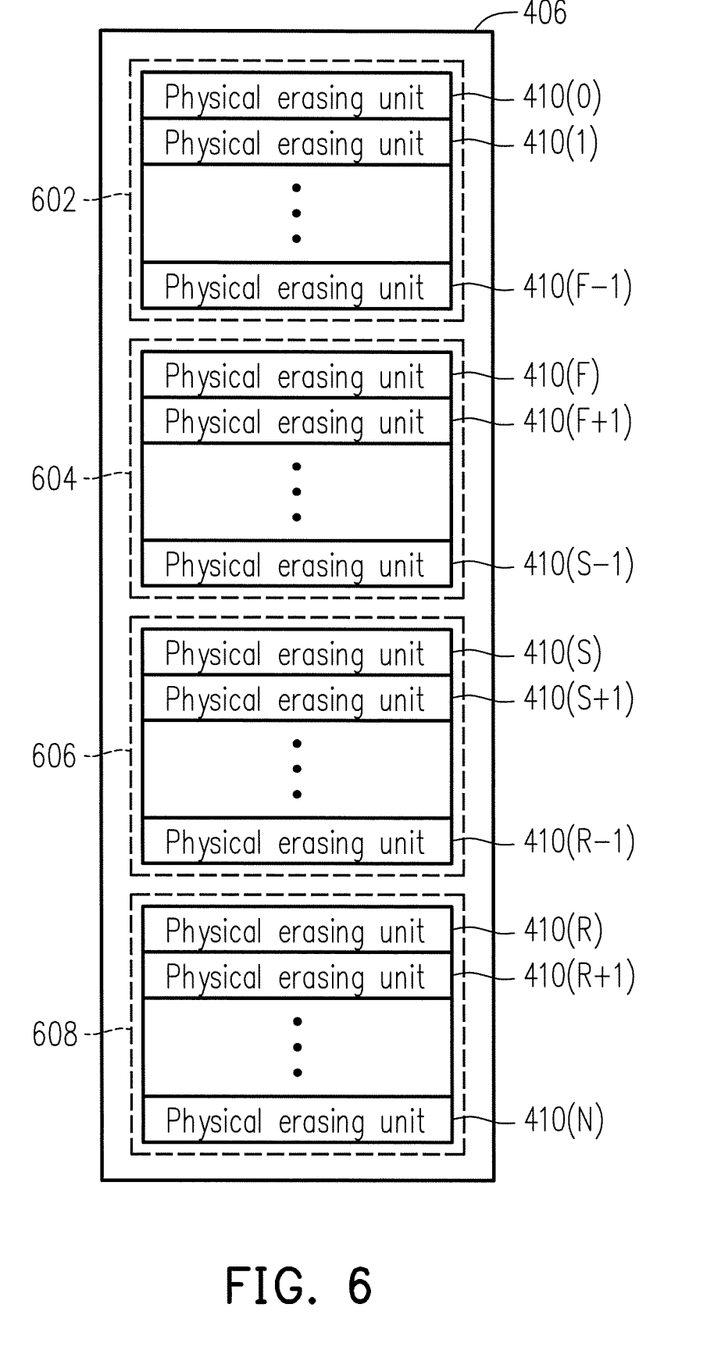
FIG. 6 and FIG. 7 are schematic diagrams illustrating the management of the physical erasing units according to an exemplary embodiment.
Figure 7:
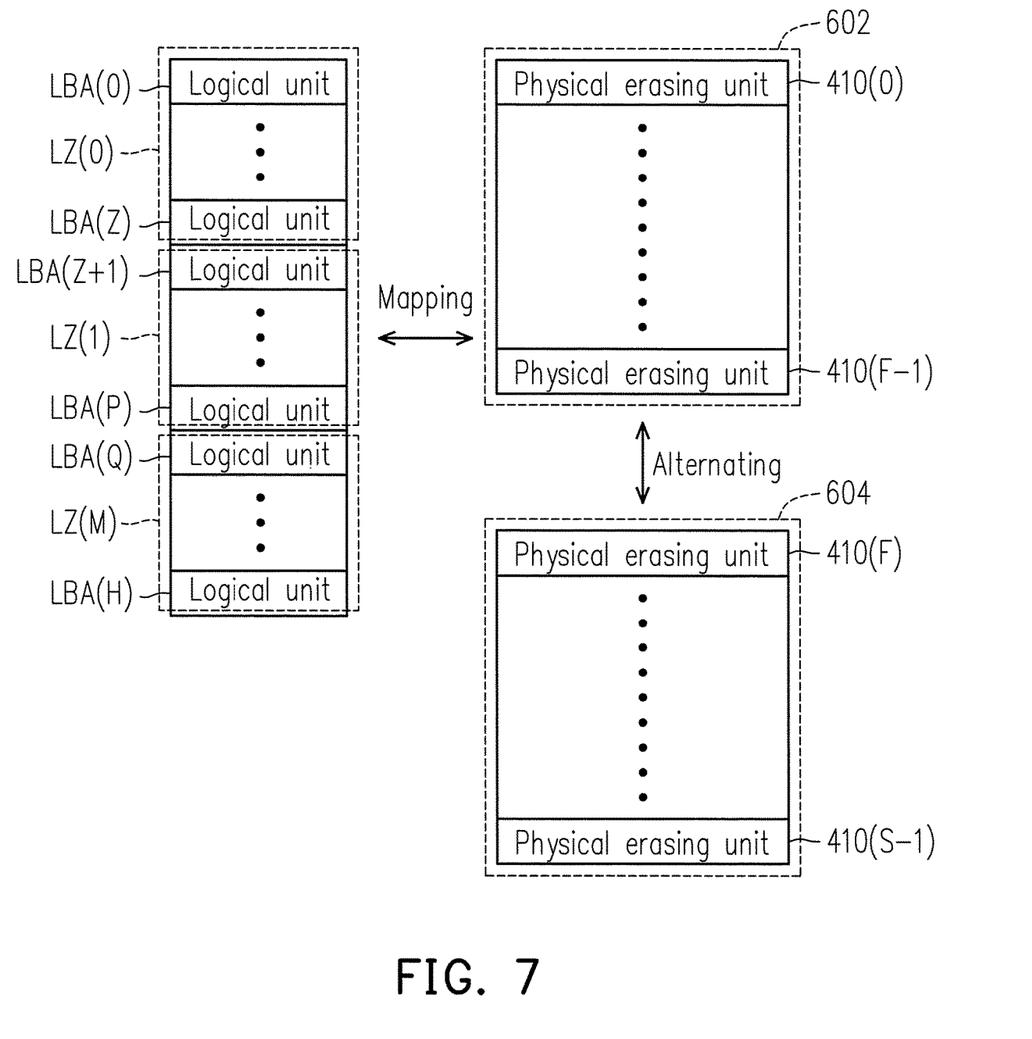

FIG. 6 and FIG. 7 are schematic diagrams illustrating the management of the physical erasing units according to an exemplary embodiment.

It should be understood that terms, such as "get", "select", "group", "divide", "associate" and so forth, are logical concepts which describe operations in the physical erasing units of the rewritable non-volatile memory module 406. That is, the physical erasing units of the rewritable non-volatile memory module 406 are logically operated, but actual positions of the physical erasing units of the rewritable non-volatile memory module are not changed.

In the following description, the operations executed by the memory management circuit 502, the host interface 504, the memory interface 506, the buffer memory 508, the power management circuit 510 and the ECC circuit 512 may also be referred to as being executed by the memory control circuit unit 404.

Referring to FIG. 6, the memory management circuit 502 logically groups the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with data, whereas the physical erasing units of the spare area 604 are configured to substitute the physical erasing units of the data area 602. In other words, when a write command and data to be written are received from the host system 11, the memory management circuit 502 selects the physical erasing units from the spare area 604, and writes the data into the selected physical erasing units to replace the physical erasing units in the data area 602.

The physical erasing units logically belonging to the system area 606 are configured to record system data. For example, the system data includes information related to the manufacturer and model of the rewritable non-volatile memory module, the number of physical erasing units in the rewritable non-volatile memory module, the number of the physical programming units in each physical erasing unit, and so forth.

The physical erasing units logically belonging to the replacement area 608 are used in a bad physical erasing unit replacement procedure for replacing damaged physical erasing units. More specifically, if there are still not nal physical erasing units in the replacement area 608, and a physical erasing unit in the data area 602 is damaged, the memory management circuit 502 selects a normal physical erasing unit from the replacement area 608 for replacing the damaged physical erasing unit.

Particularly, the numbers of the physical erasing units in the data area 602, the spare area 604, the system area 606 and the replacement area 608 may be different from one another according to the different memory specifications. In addition, it should be understood that during the operation of the memory storage device 10, grouping relations of the physical erasing units for associating with the data area 602, the spare area 604, the system area 606 and the replacement area 608 may be dynamically changed. For example, when a physical erasing unit in the spare area 604 is damaged and replaced by a physical erasing unit from the replacement area 608, the physical erasing unit originally from the replacement area 608 is associated with the spare area 604.

Referring to FIG. 7, the memory management circuit 502 may be configured with logical units LBA(0) to LBA(H) for mapping to the physical erasing units in the data area 602, and each of the logical units has a plurality of logical sub-units for mapping to the corresponding physical programming units of the physical erasing units. Further, when the host system 11 attempts to write data into the logical units or update data stored in the logical units, the memory control circuit unit 404 (or the memory management circuit 502) gets a physical erasing unit from the spare area 604 to write the data as an alternately exchange of the physical erasing units in the data area 602. In the present exemplary embodiment, the logical sub-units may be logic pages or logic sectors.

In order to identify the physical erasing unit in which the data of each logical unit is stored, in the present exemplary embodiment, the memory management circuit 502 records the mapping relations between the logical units and the physical erasing units. Further, when the host system 11 attempts to access data in a logical sub-unit, the memory management circuit 502 may confirm a logical unit which the logical sub-unit belongs to and access the data in a physical erasing unit mapped to the logical unit. For example, in the present exemplary embodiment, the memory management circuit 502 may store a logical-physical mapping table in the rewritable non-volatile memory module 406 to record the physical erasing unit mapped to each of the logical units, and the logical-physical mapping table may be loaded to the buffer memory 508 for maintenance when the memory management circuit 502 attempts to the access the data.

It should be noted that due to limited capacity, the buffer memory 508 is incapable of storing the mapping tables recording the mapping relations of all logical addresses. Therefore, in the present exemplary embodiment, the memory management circuit 502 groups the logical units LBA(0) to LBA(H) into a plurality of logical zones LZ(0) to LZ(M), and allocates a logical-physical mapping table to each logical zone. Particularly, if the memory management circuit 502 attempts to update the mapping of a specific logical unit, the logical-physical mapping table corresponding to the logical zone of the logical address is loaded to the buffer memory 508 to be updated.

Generally, before the memory storage device 10 leaves the factory, the manufacturer may use a mass production tool (MP tool) to perform an initialization operation on the memory storage device 10, for example, to initialize the memory storage device 10.

In the present exemplary embodiment, before performing the initialization operation, the manufacturer first uses an external device (which is also referred to as a first external device) to scan (e.g., perform a read and write test on) the rewritable non-volatile memory module 406 to obtain block information (which is also referred to as first block information). The first external device may be, for example, a fixture. The first block information may be used to identify normal physical erasing units and damaged physical erasing units in the rewritable non-volatile memory module 406. Then, the first external device executes an encoding unit to perform an encoding operation and/or a randomization process on the first block information to generate a first string. To be specific, a first ECC code corresponding to the first block information is generated by the encoding unit, and at least one first ECC frame is generated according to the first block information and the first ECC code. The at least one first ECC frame forms the aforementioned first string. Then, the first external device stores the first string corresponding to the first block information in the rewritable non-volatile memory module 406. In another exemplary embodiment, the first external device also inputs the first block information into an ECC circuit to encode the first block information, so as to generate another string and store this string in the rewritable non-volatile memory module 406.

The encoding unit may include one or a plurality of program codes and may be stored or configured in the aforementioned first external device. The encoding unit may be implemented by using an encoding/decoding algorithm, for example, a low density parity code (LDPC), a BCH code, a convolutional code, a turbo code or a bit flipping algorithm.

In other words, the first string written into the rewritable non-volatile memory module 406 includes the first block information and the first ECC code. Thereafter, the manufacturer may equip the rewritable non-volatile memory module 406 storing the first string on the memory storage device 10. Then, the manufacturer may use another external device (which is also referred to as a second external device) to execute the MP tool to perform the initialization operation on the rewritable non-volatile memory module 406. The second external device may be, for example, a fixture. In an exemplary embodiment, the encoding unit may also be configured in the second external device. Additionally, in another exemplary embodiment, the first external device and the second external device may be the same device.

During the initialization operation, the second external device sends a control command through the MP tool to instruct the memory management circuit 502 of the memory storage device 10 to read the first string from the rewritable non-volatile memory module 406 to obtain a data string. The second external device may execute the encoding unit and perform a decoding operation according to the data string to obtain second block information corresponding to the first block information.

In other words, the first string written into the rewritable non-volatile memory module 406 includes the first block information and the first ECC code. When the first string is read from the rewritable non-volatile memory module 406, the read data may be decoded according to the first ECC code included in the first string to obtain correct first block information. Namely, the second block information may be the same as the first block information.

Then, the second external device sends a control command through the MP tool to instruct the memory management circuit 502 to write the second block information into the rewritable non-volatile memory module 406 through the ECC circuit 512 and the randomizer circuit. Thereafter, the memory management circuit 502 inputs the second block information into the ECC circuit 512 and the randomizer circuit to perform the encoding operation and the randomization process on the second block information to generate a second string. The circuit performing the randomization process is not limited herein, and the randomization process may also be performed by the ECC circuit 512 or the memory management circuit 502. To be specific, the ECC circuit 512 generates a second ECC code corresponding to the second block information and generates at least one second ECC frame according to the second block information and the second ECC code. The at least one second ECC frame forms the aforementioned second string. Then, the memory management circuit 502 writes the second string into the rewritable non-volatile memory module 406.

Furthermore, the first block information may be the same as the second block information. Namely, both the first string and the second string are generated based on the first block information. An exemplary embodiment will be provided to describe the above-mentioned operations.

Figure 8:
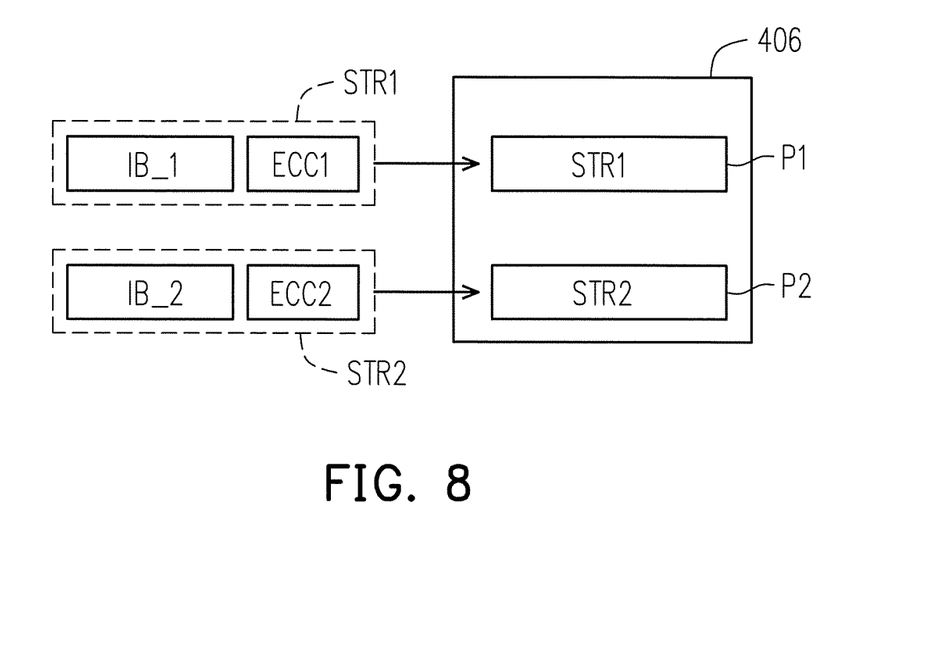
FIG. 8 is a schematic diagram illustrating a data protecting method according to an exemplary embodiment.

FIG. 8 is a schematic diagram illustrating a data protecting method according to an exemplary embodiment.

Referring to FIG. 8, before the initialization operation, the first external device obtains first block information IB_1 related to the physical erasing units 410(0) to 410(N) by scanning the rewritable non-volatile memory module 406.

After the first block information IB_1 is obtained, the encoding unit performs an encoding operation (which is also referred to as a first encoding operation) on the first block information IB_1 to generate a first ECC code ECC1. Therein, the first block information IB_1 and the first ECC code ECC1 together form the first string STR1 which is written into at least one of the physical programming units of the rewritable non-volatile memory module 406. For descriptive convenience, the first string STR1 being stored in the first physical programming unit P1 serves as an example for description.

Thereafter, the rewritable non-volatile memory module 406 is disposed in the memory storage device 10. The MP tool instructs the memory management circuit 502 to read the first string STR1 from the first physical programming unit P1 of the rewritable non-volatile memory module 406. The encoding unit decodes the read data according to the first ECC code ECC1 contained in the first string STR1 to obtain second block information IB_2. In the present exemplary embodiment, the second block information IB_2 obtained by accurately decoding and correcting the read data is the same as the first block information IB_1.

Then, the MP tool instructs the memory management circuit 502 to input the second block information IB_2 into the ECC circuit 512 to perform an encoding operation (which is also referred to as a second encoding operation) on the second block information IB_2 to obtain a second ECC code ECC2. Therein, the second block information IB_2 and the second ECC code ECC2 together form a second string STR2 which is written into at least one of the physical programming units of the rewritable non-volatile memory module 406. For descriptive convenience, the second string STR2 being stored in the second physical programming unit P2 serves as an example for description.

In other words, the rewritable non-volatile memory module 406 stores two different strings corresponding to the first block information IB_1. To be more detailed, the encoding unit encodes the first block information IB_1 obtained by scanning to generate the first string STR1, and the ECC circuit 512 encodes the first block information obtained from the first string STR1 to generate the second string STR2. Thus, both the first string STR1 and the second string STR2 are generated based on the first block information IB_1.

It should be noted that in an exemplary embodiment, one set of block information may include a corresponding ECC code. The block information and its corresponding ECC code may form an ECC frame. Thus, the string generated by encoding the block information may include an ECC frame. However, in another exemplary embodiment, the block information may be divided into a plurality of frames. Each of the frames may include a corresponding sub ECC code. Each frame and its corresponding sub ECC code may form a ECC frame. In other words, the ECC code of the block information may include a plurality of sub ECC codes. Thus, the string generated by encoding the block information may include a plurality of ECC frames.

The first block information IB_1 and the first ECC code ECC1 included in the first string STR1 may be respectively stored in a data bit area and a redundant bit area of the first physical programming unit P1, and the second block information IB_2 and the second ECC code ECC2 included in the second string STR2 may be respectively stored in a data bit area and a redundant bit area of the second physical programming unit P2. The first physical programming unit P1 and the second physical programming unit P2 may be different physical programming units and may belong to the same one physical erasing unit or different physical erasing units. However, in the rewritable non-volatile memory module 406 where one physical programming unit is capable of storing a plurality of ECC frames, the first physical programming unit P1 and the second physical programming unit P2 may be the same one physical programming unit. Although the above content is set forth by serving one physical programming units storing one ECC frame as an example, in other exemplary embodiments, one physical programming unit may also be capable of storing one or more ECC frames.

When the data is read from the rewritable non-volatile memory module 406, an ECC code corresponding to the read data is read altogether. When the number of error bits contained in the read data is greater than a maximum protection capability of the corresponding ECC code, the read data is incapable of being corrected according to the corresponding ECC code. A maximum protection capability of an ECC code refers to the maximum number of error bits that can be corrected according to the ECC code. In the present exemplary embodiment, a maximum protection capability of the first ECC code ECC1 generated by the encoding unit and a maximum protection capability of the second ECC code ECC2 generated by the ECC circuit 512 may be different. For example, based on cost consideration, limitations in hardware design or other factors, the ECC circuit 512 may be designed to generate the second ECC code ECC2 with a lower level of maximum protection capability, while the encoding unit may be designed to generate the first ECC code ECC1 with a higher level of maximum protection capability. For example, in a case that data of 1000 bits is to be protected, it is assumed that the maximum protection capability of the second ECC code ECC2 generated by the ECC circuit 512 may be 60 bits, and the maximum protection capability of the first ECC code ECC1 generated by the encoding unit may be 200 bits. As the maximum protection capabilities of the ECC codes are different, a size of the first ECC frame and a size of the second ECC frame are also different. In an exemplary embodiment, the size of the first ECC frame generated by the encoding unit may be 1 KB, and the size of the first string STR1 generated by the encoding unit may be 8 KB, but the invention is not limited thereto.

In addition, the randomization process may also be respectively performed on the second block information IB_2 and the first block information IB_1. For example, in an exemplary embodiment, the ECC circuit 512 may first perform an encoding operation on the second block information IB_2 to generate the second ECC code ECC2 and then, perform the randomization process on the second block information IB_2. The encoding unit may also perform the encoding operation on the first block information IB_1 to generate the first ECC code ECC1 and then perform the randomization process on the first block info iation IB_1. Moreover, in the present exemplary embodiment, the randomization process may further be performed on the first ECC code ECC1 and the second ECC code ECC2. However, in another exemplary embodiment, the randomization process may be first performed on the second block information IB_2, and the encoding operation may be then performed on the second block information IB_2 to generate the second ECC code ECC2. The randomization process may also be first performed on the first block information IB_1, and the encoding operation may be then performed on the first block information IB_1 to generate the first ECC code ECC1. That is, the data stored in the rewritable non-volatile memory module 406 is randomized.

In the exemplary embodiment where the data stored in the rewritable non-volatile memory module 406 is randomized, the data read from the rewritable non-volatile memory module 406 is also correspondingly restored to the original data.

Figure 9:
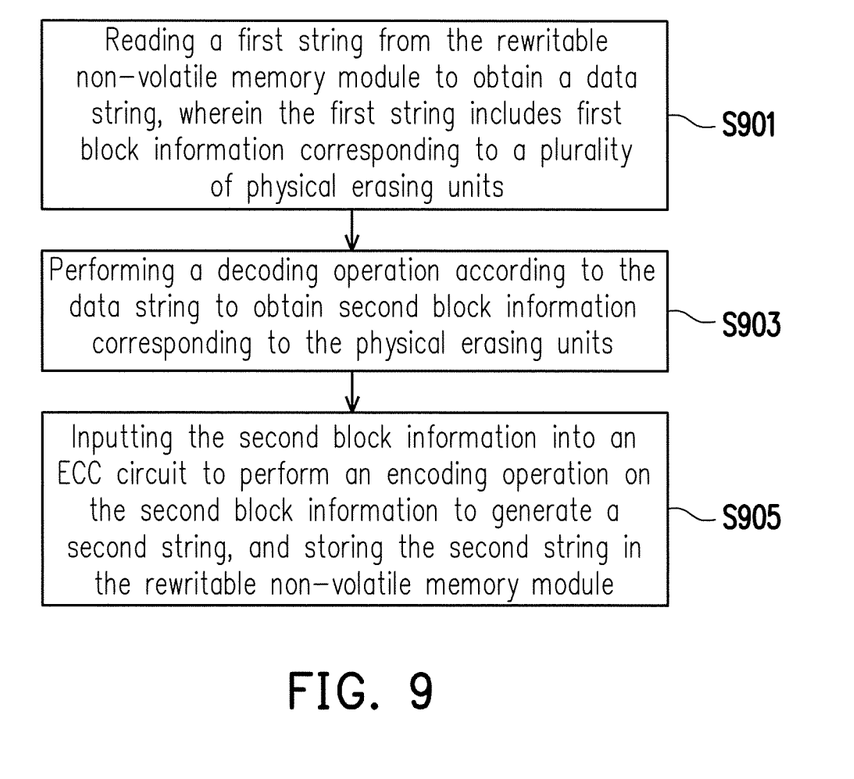
FIG. 9 is a flowchart illustrating a data protecting method according to an exemplary embodiment.

FIG. 9 is a flowchart illustrating a data protecting method according to an exemplary embodiment.

Referring to FIG. 9, in step S901, an external device instructs, through the MP tool, the memory management circuit 502 to read a first string from the rewritable non-volatile memory module to obtain a data string, wherein the first string includes first block information corresponding to a plurality of physical erasing units. In addition, the first string further includes a first ECC code. Before this step, another external device may first scan the physical erasing units of the rewritable non-volatile memory module to obtain the first block information. The first block information may at least include information configured to indicate normal physical erasing units and damaged physical erasing units. After the first block information is obtained, the aforementioned another external device performs a first encoding operation on the first block information through an encoding unit to generate the first string and store the first string in the rewritable non-volatile memory module.

Then, in step S903, the external device performs a decoding operation through the encoding unit according to the data string to obtain second block information corresponding to the physical erasing units. In this step, the encoding unit performs decoding operation according to the first ECC code in the data string to obtain the decoded data to employ it as the second block information corresponding to the physical erasing units. In the present exemplary embodiment, the second block information is the same as the first block information.

Thereafter, in step S905, the external device instructs, through the MP tool, the memory management circuit to input the second block information into an ECC circuit to perform an encoding operation on the second block information to generate a second string and store the second string in the rewritable non-volatile memory module. In this step, the rewritable non-volatile memory module is disposed in a memory storage device, and the memory storage device includes the mentioned memory management circuit and the mentioned ECC circuit.

Each step of the method illustrated in FIG. 9 has been described in detail in the exemplary embodiments above and will not be repeated hereinafter.

As described in the exemplary embodiments above, the encoding unit may also be configured to perform the decoding operation. Thus, when the rewritable non-volatile memory module 406 is disposed in another memory storage device which is different from the memory storage device 10, the data stored in the rewritable non-volatile memory module 406 may be decoded by, for example, an encoding unit stored in another external device to obtain accurate block information.

Figure 10:
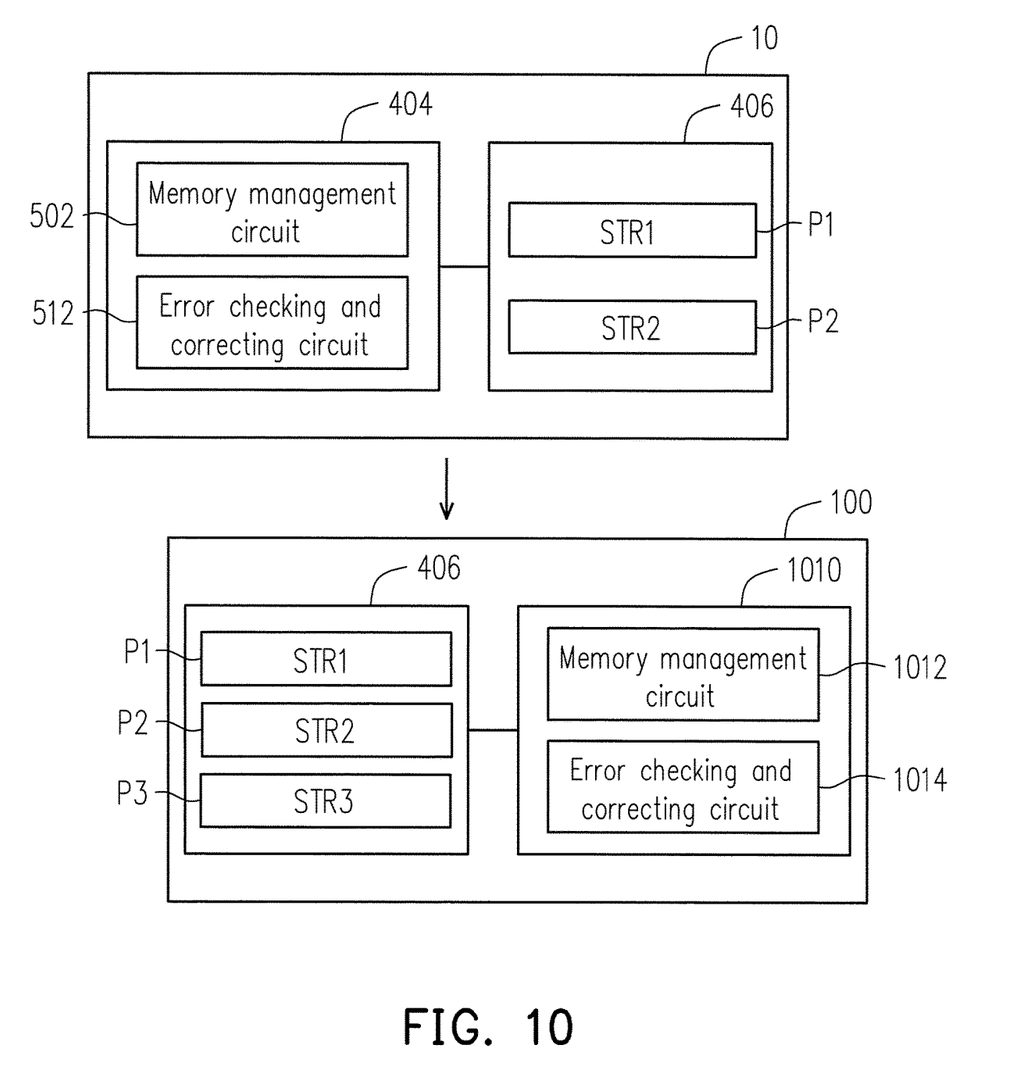
FIG. 10 is a schematic diagram illustrating a data protecting method according to another exemplary embodiment.

FIG. 10 is a schematic diagram illustrating a data protecting method according to another exemplary embodiment.

Referring to FIG. 10, in the similar way to the exemplary embodiment illustrated in FIG. 8, after the scanning operation before the initialization operation and the initialization operation of the rewritable non-volatile memory module 406 are completed, the rewritable non-volatile memory module 406 disposed in the memory storage device 10 stores the first string STR1 and the second string STR2 corresponding to block information.

In the present exemplary embodiment, a memory storage device 100 is another device which is different from the memory storage device 10. A memory control circuit unit 1010 of the memory storage device 100 includes a memory management circuit 1012 and an ECC circuit 1014. The ECC circuit 1014 of the memory storage device 100 and the ECC circuit 512 of the memory storage device 10 are implemented by using different encoding/decoding algorithms.

As illustrated in FIG. 10, when the rewritable non-volatile memory module 406 storing the first string STR1 and the second string STR2 is changed to be disposed in the memory storage device 100, the manufacturer uses the MP tool to perform the initialization operation again on the rewritable non-volatile memory module 406.

In the present exemplary embodiment, the MP tool first finds out a first physical programming unit P1 storing the first string STR1 and reads the first string STR1 from the first physical programming unit P1. Then, the encoding unit performs the decoding operation according to the read first string STR1 to obtain accurate block information. In other words, the external device receives the first string STR1 returned by the memory management circuit 1012 and executes the encoding unit to correct the read data according to the a first ECC code included in the first string STR1 to obtain the accurate block information.

For example, the data included in the first string STR1 is the data which is randomized, thus, the encoding unit perform the restore operation to restore the read data and correct the read data according to the first ECC code included in the first string STR1 to obtain the accurate block information. Then, the MP tool instructs the memory management circuit 1012 to input the accurate block information into the ECC circuit 1014 to perform the encoding operation and the randomization process on the input block information to generate a third string STR3 corresponding to the accurate block information. Then, the MP tool instructs the memory management circuit 1012 to store the third string STR3 in a third physical programming unit P3 of the rewritable non-volatile memory module 406. In other words, the accurate block information may be obtained directly from the first physical programming unit P1, without scanning again the rewritable non-volatile memory module 406.

In addition, since the ECC circuit 1014 of the memory storage device 100 and the ECC circuit 512 of the memory storage device 10 use different encoding/decoding algorithms, the ECC circuit 1014 is incapable of decoding the data read from the second physical programming unit P2. Therefore, in an exemplary embodiment, the memory management circuit 1012 may also set the data (i.e., the second string STR2) stored in the second physical programming unit P2 as invalid data.

In view of the foregoing, in the present invention, the encoding operation is performed on one block information by the encoding unit configured in the external device to generate a corresponding string, the encoding operation is performed on another block information same as the aforementioned block information by the ECC circuit of the memory storage device to generate another string, and the two encoded strings corresponding to the block information can be stored in the rewritable non-volatile memory module. In this way, when the rewritable non-volatile memory module is disposed in another memory storage device, the accurate block information can be obtained by reading the corresponding string from the rewritable non-volatile memory module. Thereby, the time required for the process of the rework operation can be effectively reduced. Further, performing the encoding operation by the encoding unit can facilitate enhancing the protection capability for the block information. The previously described exemplary embodiments have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data protecting method for a rewritable non-volatile memory module comprising a plurality of physical erasing units, the data protecting method comprising:

reading a first string from the rewritable non-volatile memory module to obtain a data string, wherein the first string comprises first block information corresponding to the physical erasing units and a first error checking and correcting code;

performing a decoding operation according to the data string to obtain second block information corresponding to the physical erasing units; and inputting the second block information into an error checking and correcting circuit of a memory storage device equipped with the rewritable non-volatile memory module to perform an encoding operation on the second block information to generate a second string comprising a second error checking and correcting code, wherein a maximum protection capability of the first error checking and correcting code is different from a maximum protection capability of the second error checking and correcting code; and storing the second string in the rewritable non-volatile memory module, wherein the first string is generated by an external device different from the memory storage device, wherein the first block information identifies normal physical erasing units and damaged physical erasing units of the physical erasing units, and the second block information identifies the normal physical erasing units and the damaged physical erasing units of the physical erasing units.

2. The data protecting method according to claim 1, wherein the first block information is the same as the second block information.

3. The data protecting method according to claim 1, wherein the step of performing the decoding operation according to the data string to obtain the second block information comprises:

performing the decoding operation according to the first error checking and correcting code in the data string to obtain the second block information.

4. The data protecting method according to claim 3, wherein the step of inputting the second block information into the error checking and correcting circuit of the memory storage device equipped with the rewritable non-volatile memory module to perform the encoding operation on the second block information to generate the second string comprises:
   performing the encoding operation on the second block information by the ECC circuit of the memory storage device equipped with the rewritable non-volatile memory module to generate the second error checking and correcting code; and
   generating the second string according to the second block information and the second error checking and correcting code.

5. The data protecting method according to claim 4, wherein the first block information and the first error checking and correcting code form at least one first error checking and correcting frame, and the second block information and the second error checking and correcting code form at least one second error checking and correcting frame, wherein a size of the at least one first error checking and correcting frame and a size of the at least one second error checking and correcting frame are not the same.

6. The data protecting method according to claim 1, further comprising:
   scanning the physical erasing units to generate the first block information before an initialization operation of the rewritable non-volatile memory module is performed.

7. The data protecting method according to claim 6, wherein the external device comprises an encoding unit, wherein the encoding unit performs an encoding operation according to the first block information to generate the first error checking and correcting code and generate the first string according to the first block information and the first error checking and correcting code.

8. The data protecting method according to claim 1, wherein the physical erasing units comprises a plurality of physical programming units, and the first string is stored in at least one first physical programming unit among the physical programming units,
   wherein the step of storing the second string in the rewritable non-volatile memory module comprises:
   storing the second string in at least one second physical programming unit among the physical programming units.

9. The data protecting method according to claim 8, wherein the at least one first physical programming unit and the at least one second physical programming unit belong to a first physical erasing unit among the physical erasing units.

10. A memory storage device, comprising:
   a connection interface unit, configured to couple to a host system;
   a rewritable non-volatile memory module, comprising a plurality of physical erasing units; and
   a memory control circuit unit, configured to couple to the connection interface unit and the rewritable non-volatile memory module and having an error checking and correcting circuit,
   wherein a first string and a second string are stored in the rewritable non-volatile memory module, wherein the first string comprises first block information and a first error checking and correcting code, and the second string comprises second block information and a second error checking and correcting code,
   wherein the first error checking and correcting code is generated according to the first block information by an external device executing an encoding unit, and the second error checking and correcting code is generated according to the second block information by the error checking and correcting circuit,
   wherein the second block information is generated by performing a decoding operation according to the first string,
   wherein a maximum protection capability of the first error checking and correcting code is different from a maximum protection capability of the second error checking and correcting code,
   wherein the first block information identifies normal physical erasing units and damaged physical erasing units of the physical erasing units, and the second block information identifies the normal physical erasing units and the damaged physical erasing units of the physical erasing units.

11. The memory storage device according to claim 10, wherein the second block information is the same as the first block information.

12. The memory storage device according to claim 10, wherein the memory control circuit unit is further configured to input the second block information into the error checking and correcting circuit according to a control command of the external device to generate the second error checking and correcting code, generate the second string according to the second block information and the second error checking and correcting code, and store the second string in the rewritable non-volatile memory module.

13. The memory storage device according to claim 10, wherein the first string is stored in the rewritable non-volatile memory module before an initialization operation of the rewritable non-volatile memory module is performed.

14. The memory storage device according to claim 10, wherein the first block information and the first error checking and correcting code form at least one first error checking and correcting frame, and the second block information and the second error checking and correcting code form at least one second error checking and correcting frame, wherein a size of the at least one first error checking and correcting frame is not the same as a size of the at least one second error checking and correcting frame.

15. The memory storage device according to claim 10, wherein the physical erasing units comprise a plurality of physical programming units, wherein the first string is stored in at least one first physical programming unit among the physical programming units, and the second string is stored in at least one second physical programming unit among the physical programming units.

16. The memory storage device according to claim 15, wherein the at least one first physical programming unit and the at least one second physical programming unit belong to a first physical erasing unit among the physical erasing units.

17. A memory storage device, comprising:
   a connection interface unit, configured to couple to a host system;
   a rewritable non-volatile memory module, comprising a plurality of physical erasing units; and
   a memory control circuit unit, configured to couple to the connection interface unit and the rewritable non-volatile memory module and having an error checking and correcting circuit,
   wherein a first string and a second string are stored in the rewritable non-volatile memory module, wherein the first string comprises first block information and a first error checking and correcting code, and the second string comprises second block information and a second error checking and correcting code, wherein the first error checking and correcting code is generated according to the first block information by an external device executing an encoding unit, and the second error checking and correcting code is generated according to the second block information by the error checking and correcting circuit, wherein the first error checking and correcting code is different from the second error checking and correcting code, wherein a maximum protection capability of the first error checking and correcting code is different from a maximum protection capability of the second error checking and correcting code, wherein the first block information identifies normal physical erasing units and damaged physical erasing units of the physical erasing units, and the second block information identifies the normal physical erasing units and the damaged physical erasing units of the physical erasing units.

18. The memory storage device according to claim 17, wherein the second block information is the same as the first block information.

19. The memory storage device according to claim 17, wherein the physical erasing units comprise a plurality of physical programming units, wherein the first string is stored in at least one first physical programming unit among the physical programming units, and the second string is stored in at least one second physical programming unit among the physical programming units.

20. The memory storage device according to claim 19, wherein the at least one first physical programming unit and the at least one second physical programming unit belong to a first physical erasing unit among the physical erasing units.

* * * * *